(12) United States Patent
Miller et al.

(10) Patent No.: US 8,595,391 B1
(45) Date of Patent: Nov. 26, 2013

(54) AUTOMATIC QUEUE SIZING FOR DATAFLOW APPLICATIONS

(75) Inventors: Ian D. Miller, Charlotte, NC (US); Jorn W. Janneck, San Jose, CA (US); David B. Parlour, Fox Chapel, PA (US)

(73) Assignee: Xilinx, Inc., San Jose, CA (US)

( * ) Notice: Subject to any disclaimer, the term of this patent is extended or adjusted under 35 U.S.C. 154(b) by 1318 days.

(21) Appl. No.: 12/048,588

(22) Filed: Mar. 14, 2008

(51) Int. Cl.
*G06F 5/00* (2006.01)

(52) U.S. Cl.
USPC .......................................................... 710/52

(58) Field of Classification Search
None
See application file for complete search history.

(56) References Cited

U.S. PATENT DOCUMENTS

| | | | | |
|---|---|---|---|---|
| 6,044,418 A | * | 3/2000 | Muller | 710/56 |
| 6,088,716 A | * | 7/2000 | Stanfill et al. | 718/106 |
| 7,761,272 B1 | * | 7/2010 | Janneck et al. | 703/13 |
| 2003/0216901 A1 | * | 11/2003 | Schaumont et al. | 703/13 |
| 2004/0181387 A1 | * | 9/2004 | Petersen | 703/22 |
| 2006/0123424 A1 | * | 6/2006 | Hunt et al. | 719/310 |

OTHER PUBLICATIONS

Bhattacharyya, Shuvra et al., "vol. 1—Ptolemy 0.7 User's Manual," The Regents of the University of California, copyright 1990-1997, downloaded on Feb. 15, 2008 from www.ptolemy.eeecs.berkeley.edu.
Engels, Marc et al., "Cyclo-Static Dataflow: Model and Implementation," 1994 Conference Record of the 28th Annual Asilomar Conference on Signals, Systems and Computers, Oct. 31-Nov. 2, 1994, pp. 503-507, vol. 1, Pacific Grove, California.
Bilsen, Greet et al., "Cyclo-Static Dataflow," *IEEE Transactions on Signal Processing*, Feb. 1996, pp. 397-408, vol. 44, No. 2.
Lee, Edward A. et al., "Synchronous Data Flow," *Proceedings of the IEEE*, Sep. 1987, pp. 1235-1245, vol. 75, No. 9.

* cited by examiner

*Primary Examiner* — Henry Tsai
*Assistant Examiner* — Aurangzeb Hassan
(74) *Attorney, Agent, or Firm* — W. Eric Webostad; Gerald Chan; LeRoy D. Maunu

(57) ABSTRACT

Automatic queue sizing for data flow applications for an integrated circuit is described. Queue sizes for queues of a dataflow network are initialized to a set of first sizes for running as distributed actors without having to have centralized control. If it is determined there is a deadlock, causes for the dataflow network being deadlocked are analyzed with a controller coupled thereto to select a first actor thereof. The first actor of the dataflow network is selected as being in a stalled write phase state. Queue size is incremented for at least one queue of the queues to unlock the first actor from the stalled write phase state. The running, the determining, the analyzing, and the incrementing are iteratively repeated to provide a second set of sizes for the queue sizes sufficient to reduce likelihood of deadlock of the data flow network.

18 Claims, 6 Drawing Sheets

AUTOMATIC QUEUE SIZING FOR DATAFLOW APPLICATIONS

FIELD OF THE INVENTION

The invention relates to integrated circuit devices (ICs). More particularly, the invention relates to automatic queue sizing for dataflow applications for an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration ("programming") sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Generally, with respect to dataflow networks, an "actor" may be described as a processing element that consumes and produces data. The consumption and the production of data is generally considered to be in a form known as a "token." When constructing an implementation of a dataflow network from a dataflow specification with regard to sizing of queues between actors, such queues may have a depth which is excessive. For example, if queues are implemented with first-in, first-out buffers ("FIFOs"), then such FIFOs may have the ability to hold more tokens than may be processed at a time when operating such a dataflow network. Having FIFOs that are too large consumes resources unnecessarily, which may unnecessarily increase the cost of an implementation of such a dataflow specification. Contrastingly, if such FIFOs are made too small, the resulting dataflow network may be slowed unnecessarily. Moreover, if such FIFOs in a dataflow network are too small, a deadlock condition may result.

If a dataflow network may be scheduled statically, such as a Synchronous Dataflow ("SDF") network or a Cyclo-Static Dataflow ("CSDF") network, it may be possible to analytically determine queue sizes for a variety of targeted performance parameters. These targeted performance parameters may preclude such a dataflow network from deadlocking.

However, in a dataflow network where data consumption and data production of actors are data dependent, it is not possible to analytically determine queue sizes to avoid deadlock of such a dataflow network. Thus, a designer has to determine appropriate queue sizes based on prior experience or particular knowledge of the application. However, even though it may have been possible for a designer to include queue sizes that precluded deadlocks, such queue sizes may have still been too large, leading to unnecessary consumption of queue resources.

SUMMARY OF THE INVENTION

One or more embodiments of the invention generally relate to integrated circuits and, more particularly, to automatic queue sizing for data flow applications for an IC.

One embodiment of the invention relates generally to a method for queue sizing. A dataflow network is obtained. Queue sizes for queues of the dataflow network are initialized to a set of first sizes. The dataflow network is run as distributed actors without having to have centralized control. It is determined if the dataflow network is deadlocked. Causes for the dataflow network being deadlocked are analyzed using a centralized controller coupled to the dataflow network to select a first actor of the actors thereof. The first actor of the dataflow network is selected as being in a stalled write phase state. Queue size is incremented for at least one queue of the queues to unlock the first actor from the stalled write phase state. The running, the determining, the analyzing, and the incrementing are iteratively repeated to provide a second set of sizes for the queue sizes sufficient to reduce likelihood of deadlock of the data flow network.

Another embodiment of the invention relates generally to a method for sizing queues of a dataflow network. Actors and the queues are coupled to provide dataflow chains and are coupled to a controller. The controller is configured to allocate storage for the sizing of the queues. Sizes of the queues of the dataflow network are set by: initializing the sizes to a set of first sizes; running the dataflow network as distributed actors without having to have centralized control; determining if the dataflow network is deadlocked; analyzing using the controller causes for the dataflow network being deadlocked to select a first actor of the actors thereof; selecting the first actor of the dataflow network as being in a stalled write phase state; incrementing size for at least one queue of the queues to unlock the first actor from the stalled write phase state; and iteratively repeating the running, the determining, the analyzing, and the incrementing to provide a second set of sizes for the sizes of the queues sufficient to reduce likelihood of deadlock of the data flow network.

Yet another aspect of the invention relates generally to a runtime extendable queue. A buffer has a first capacity. Allocable storage is coupled to the buffer and has a second capacity. Circuitry couples the allocable storage to the buffer for concatenating the first capacity and the second capacity responsive to a full condition of the buffer.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

In the following description, a dataflow network which is data dependent is described. Queue sizes are determined during execution of a dataflow program for the dataflow network. In other words, the result of running a software tool associated with a dataflow network yields queue sizes that allow functioning without deadlock of the dataflow network and without excessive use of queue resources. As shall be appreciated from the following description, queues are not expansively sized, but are sized sufficient to avoid deadlock. Furthermore, as shall be appreciated from the following description, such deadlock may be avoided by implementing execution by parallel chains of actors.

As shall be appreciated from the following description, a dataflow network that is self-scheduling is described. In other words, dataflow from actor to actor is data dependent without having to have a separate scheduler block. Furthermore, from the following description, it should be understood that such a dataflow network may have a single clock domain or multiple clock domains. Thus, it should be appreciated that such a dataflow network is regulated according to the flow of data, which may or may not be dependent upon one or more clock domains.

Figure 1:
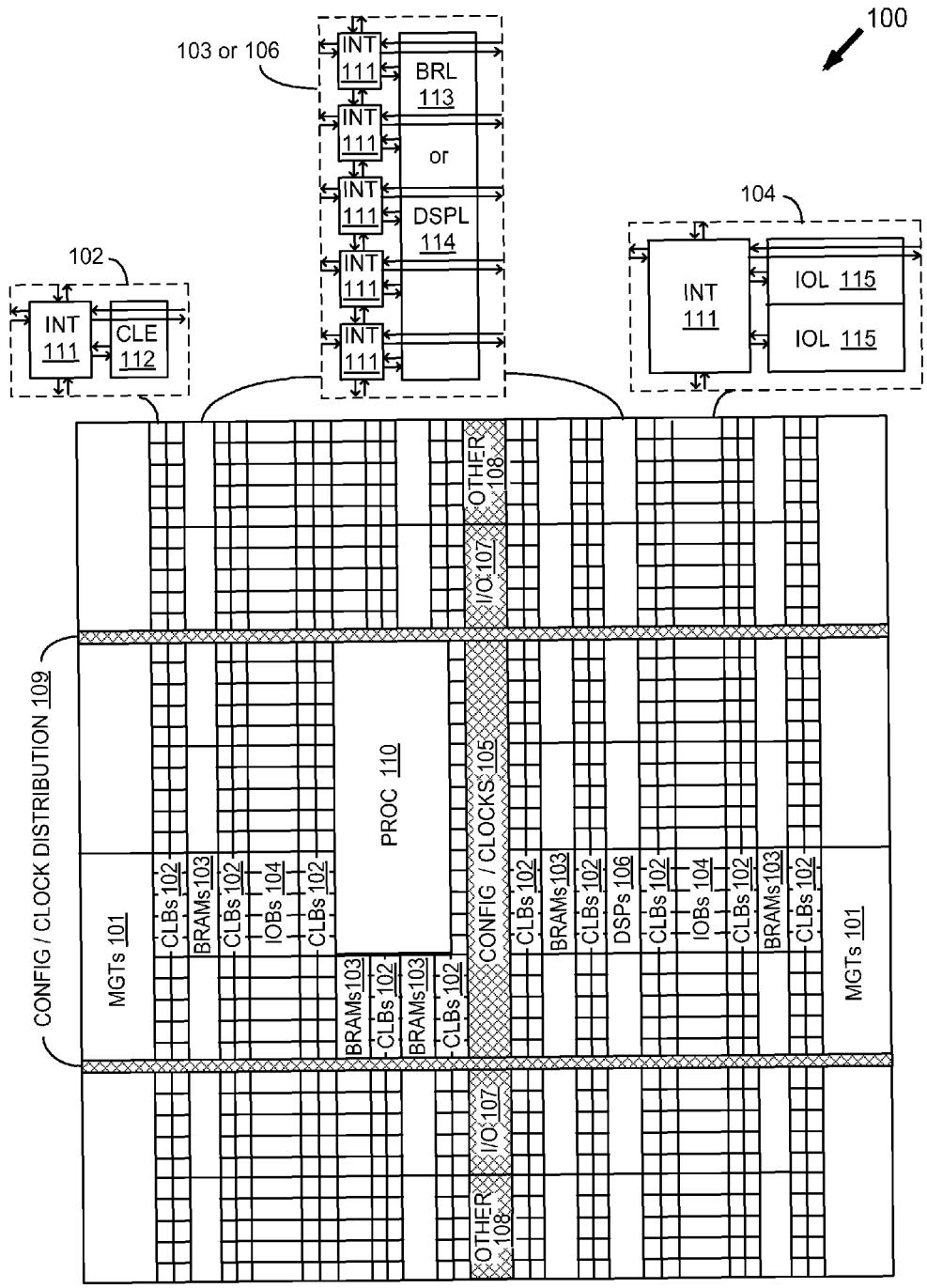
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs 101"), configurable logic blocks ("CLBs 102"), random access memory blocks ("BRAMs 103"), input/output blocks ("IOBs 104"), configuration and clocking logic ("CONFIG/CLOCKS 105"), digital signal processing blocks ("DSPs 106"), specialized input/output blocks ("I/O 107") (e.g., configuration ports and clock ports), and other programmable logic 108 such as digital clock managers, analog-to-digital converters, system monitoring logic, and so forth. Some FPGAs also include dedicated processor blocks ("PROC 110").

It is noted here that embodiments of the present invention are not restricted to implementation in FPGAs. Some embodiments are implemented in other types of integrated circuits such as application-specific integrated circuits (ASICs). However, descriptions of embodiments implemented in FPGAs are used herein in order to fully describe and clearly explain aspects of various embodiments.

In some FPGAs, each programmable tile includes a programmable interconnect element ("INT 111") having standardized connections to and from a corresponding interconnect element in each adjacent tile. Therefore, the programmable interconnect elements taken together implement the programmable interconnect structure for the illustrated FPGA. The programmable interconnect element ("INT 111") also includes the connections to and from the programmable logic element within the same tile, as shown by the examples included at the top of FIG. 1.

For example, a CLB 102 can include a configurable logic element ("CLE 112") that can be programmed to implement user logic plus a single programmable interconnect element ("INT 111"). A BRAM 103 can include a BRAM logic element ("BRL 113") in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL 114") in addition to an appropriate number of programmable interconnect elements. An IOB 104 can include, for example, two instances of an input/output logic element ("IOL 115") in addition to one instance of the programmable interconnect element ("INT 111"). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
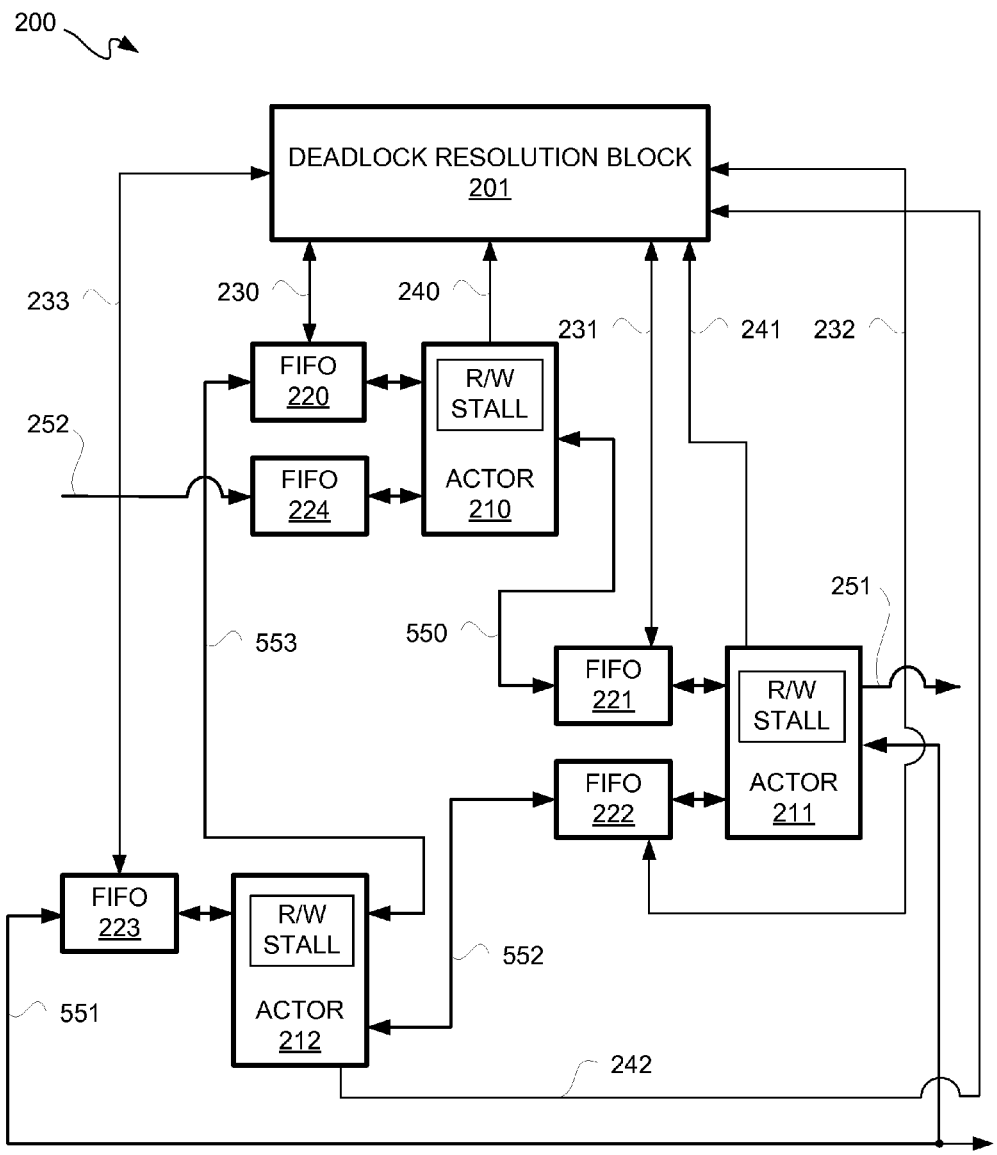
FIG. 2 is a block diagram depicting an exemplary embodiment of a dataflow network.

FIG. 2 is a block diagram depicting an exemplary embodiment of a dataflow network 200. Even though the following description is in terms of hardware, which may be instantiated in programmable logic, it should be understood that a dataflow network may be implemented in software, hardware, or a combination thereof. Dataflow network 200 includes actors 210 through 212, FIFOs 220 through 224, and deadlock resolution block 201. FIFOs 220 through 223 are coupled to deadlock resolution block 201 via control signals 230 through 233, respectively. As described below in additional detail, actors 210 through 212 may provide control signals 240 through 242 to deadlock resolution block 201.

Even though specific numbers of FIFOs and actors are illustratively depicted, it should be appreciated that many more FIFOs and actors may be implemented in accordance with the description herein. Furthermore, it should be appreciated that dataflow network 200 may be a stand-alone dataflow network or a sub-network of a larger network. The larger network may also be or include a dataflow network, which may affect the dependencies of dataflow network 200, as described below in additional detail. With respect to dataflow network 200 being a sub-network of a larger network, dataflow network 200 may be part of a hierarchy of sub-networks forming an overall network.

As described above, actors 210 through 212 are processing elements that consume and produce data in the form of "tokens." For example, a token may be a packet of data that is communicated within dataflow network 200 atomically. By "atomically," it is meant that a token may be sent or received either in its entirety or not at all. In other words, atomic level communication means that entire units of tokens are sent and received without ever sending or receiving of any partial token. Generally, such tokens are communicated atomically via peer-to-peer communication links.

An actor 210 may send a token which is buffered in FIFO 221 for actor 211. This type of operation with respect to actor 210 would be a write of an output token. For actor 211 to process such a token, actor 211 would read such token from FIFO 221, namely a read of an input token. Thus, actors, such as actors 210 through 212, may be in a loop for processing tokens, where each actor has three distinct phases, namely a read phase, a compute phase, and a write phase.

If an actor is not executing one of the three phases, such actor may be in one of three possible idle states. More particularly, an actor that is not executing may be: terminated, as its processing has been stopped, such as after completion; waiting for input, namely waiting to receive a token that may be read; or waiting for queue space in which to write an output token. An actor may occupy only one of these three idle states at a time.

An actor that is waiting for input, namely waiting to receive an input token, does not proceed to a compute phase as it needs to receive at least one such input token on an incoming communication link to proceed. Such an actor may be said to be stuck or stalled in a read phase. An actor that is waiting for output space in an associated output queue, such as output FIFO space, may be said to be stuck or stalled in a write phase. In other words, such an actor may have read one or more input tokens and finished computing responsive to such one or more input tokens, but due to insufficient space available in a FIFO to which to write a resulting output token is stuck in a write phase. Being stalled in a write phase may be generally thought of as an outgoing channel being backed up, such that the submission of another output token would produce an overflow condition.

More generally, a dataflow network has a set of actors A and a set of connections E between the set of actors A. These connections between actors 210 through 212 of dataflow network 200 are generally represented as connections 550, 551, 552, and 553. Connections 550 through 553 may be thought of as communication channels between actors. Communication channels 550 through 553 are bounded by queues, namely FIFOs 221, 223, 222, and 220, respectively. As described below in additional detail, the bounds of these FIFOs 220 through 223 are determined automatically by execution of a dataflow program.

Mathematically, for each connection "e" being an element of the set of the connections E, an integer "$n_e$" greater than or equal to 0 may be found such that dataflow network 200 executes without deadlocking. Thus, the value of $n_e$ is the queue size or in this example the depth of one of FIFOs 220 through 223. It should be noted that the value of $n_e$, as determined by execution of a dataflow program, may be zero. In other words, the FIFO itself may be omitted.

The structure of a dataflow graph for dataflow network 200 is given by the functions of source "s" and destination "d", where s and d are both functions from E to A, which for a given connection provides the source actor s and destination actor d, respectively. Functions s and d assign each edge/dataflow connection e in E a source s(e) and a destination d(e), so both s and d can be seen as functions from the edges to the actors. At any point in time, a communication link or channel 550 through 553 may be in one of three states, namely flowing "F", low "L", or high "H." A communication link is low L if there has been a request for a token, namely a read by an actor at a receive end of such communication link, that could not be satisfied due to there being at least one token lacking to fulfill such request. A low L communication link is not the same as having an empty communication link, namely not having any communication tokens in a FIFO bounding the communication link. Rather, a low L communication link is one that stalls a destination actor d, because such destination actor d is waiting upon at least one token, and such destination actor d cannot proceed from a read phase to a compute phase until such request for one or more tokens has been satisfied.

So, if a FIFO bounding a communication link is empty but the actor that reads from such FIFO is not stalled in a read phase, such communication link is in a flowing F state. For example, actor 212 has one input FIFO, namely FIFO 223, associated with input communication channel 551. A request by actor 212 may be for one or more tokens from FIFO 223. However, actor 211 has two input FIFOs, namely FIFOs 221 and 222. Input communication channel 550 and input communication channel 552, respectively from actors 210 and 212 to FIFOs 221 and 222, may mean that actor 211 processes at least two tokens during a compute phase, namely at least one token from each of FIFOs 221 and 222. It should be appreciated that the number of tokens read by an actor during a read phase, even though a single buffer is illustratively shown, may exceed one. Thus, for example, two or more tokens may be read at a time from a FIFO. Likewise, merely because two buffers, such as FIFOs 221 and 222, exist on an input side of an actor, such as actor 211, does not necessarily mean that both buffers are read at the same time for input to a compute phase.

To summarize, a queue with an input communication link in a low L state is always empty. However, an empty queue does not necessarily mean that the input communication link is in a low L state. With respect to the latter, if a destination actor is not stalling due to waiting for execution of a read phase, namely not stalling waiting for input of a token to read, such actor may be in a data flowing F state.

Similarly, an output communication link in a high H state is one that is not ready to accept a token output from an actor which is ready to be sent because a FIFO bounding with such output communication link is presently full. Whereas an input communication link in a low L state stalls an input side of an actor coupled thereto via a FIFO in a read phase, an output communication link in a high H state stalls an output side of an actor directly coupled thereto in a write phase. However, for a high H state of an output communication link, the actor being stalled is the producer of a token; in other words, the source actor is stalled in a write phase. A queue, such as a FIFO, in a full state does not necessarily mean that the communication link coupled thereto is in a high H state. An output communication link is only in a high H state if a token is ready to be written to a FIFO coupled thereto and such FIFO cannot receive such token because it is full.

Lastly, a communication link in a flowing F state is one that is neither in a high H state nor in a low L state. An output communication link may be the same as an input communication link, and the modifying terms "input" and "output" are used to identify relationship to either a destination or source actor, respectively, or alternatively to identify relationship to direction of dataflow.

Actors 210 through 212 are generally depicted as interim actors of dataflow network 200. However, it should be appreciated that there may be other types of actors which have either no incoming or no outgoing connections, namely input actors and output actors, respectively, representing input and output ports of dataflow network 200. Generally, these input and output actors may be thought of as the interface of dataflow network 200 with its surrounding environment. However, it should be appreciated that an interim actor may be used as an output actor of a dataflow network. For example, output 251 of actor 211 may be an output of dataflow network 200.

However there may be one or more additional FIFOs, such as FIFO 224, coupled to receive an input to dataflow network 200, such as input 252, for providing such input to an actor, such as actor 210, and thus an interim actor may be an input actor. However, for purposes of clarity and not limitation, only interim operation of dataflow network 200 is described, as providing input to and output from dataflow network 200 shall be understood from the following description.

Dataflow network 200 is externally unconstrained if no communication channel(s) providing input to an input actor(s) are in a low L state and if no communication channel(s) receiving output from an output actor(s) are in a high H state. In other words, the environment to which dataflow network 200 is coupled is reading and writing data to and from dataflow network 200 without stalling on an input or an output side thereof.

As previously mentioned, dataflow network 200 may be a sub-network of a larger network which may be hierarchical, and thus in evaluating deadlock of dataflow network 200 as part of a larger network, such input and output states may be taken into consideration. However, because the integration of dataflow network 200 as part of a larger network will be understood from the description of the operation of dataflow network 200 itself, such description of dataflow network 200 as part of a larger network is generally omitted for purposes of clarity and not limitation.

An actor in a stalled condition is different from a dead actor. A dead actor has terminated its execution. Additionally, a dead actor may be an actor which is stalled due to waiting on input from an actor which has terminated its execution. In other words, any actor stalled waiting for input from a dead actor is likewise a dead actor. For example, if actor 211 had terminated, actor 211 would be a dead actor, and actor 212, which would stall waiting for input from actor 211, would likewise be a dead actor. It should be appreciated that the condition of being a dead actor naturally propagates downstream. Whether or not the condition of being a dead actor propagates upstream, namely against the direction of dataflow, depends upon implementation.

A dead actor has ceased execution, so such a dead actor will not read any of its input tokens provided via an input communication link. Consequently, an input queue associated with such an input communication link may eventually be full, which may stall the producer of tokens feeding such input queue, namely stall a source actor. Thus, once a source actor runs out of output space in such an input queue, it may not be able to write tokens to such an input queue. Alternatively, an input communication link may merely discard data in an input queue associated with a dead actor and thus may avoid becoming a dead actor. Thus, an actor may detect that it is dead and communicate such detected dead state to its associated downstream queue or queues to cause them to purge current and subsequently received tokens.

In addition, an actor in an input-stalled loop is a dead actor. Actors 210 through 212 are in a loop. An input-stalled loop is a sequence of distinct actors, such as actors 210, 211, and 212, such that there is at least one low communication link from any actor in the loop to its immediately subsequent actor in the loop, and from a final actor of the loop sequence to an initial actor in the loop sequence. More generally, if the loop sequence of distinct actors is $\alpha_1 \ldots \alpha_m$, for m a positive integer greater than one, there is at least one communication link in a low L state from any $\alpha_i$ to any $\alpha_{i+1}$ or from $\alpha_m$ to $\alpha_1$.

With this nomenclature, operation of dataflow network 200 for automatically determining size of queues, such as FIFOs 220 through 223, is further described. Along those lines, it shall continue to be assumed that dataflow network 200 is an externally unconstrained network. Furthermore, it shall be assumed that dead actors, if any, have been removed from dataflow network 200. Again, the precise definition of a dead actor may depend upon the specific implementation due to different alternatives of handling upstream propagation. However, it shall be assumed that none of actors 210 through 212 is dead. In other words, after removal of such dead actors, dataflow network 200 is not empty, namely actors 210, 211, and 212 are present. Moreover, after removal of dead actors, dataflow network 200 remains coupled to its environment.

For purposes of the following description of operation of dataflow network 200, at any point in time there is a function N which defines the queue size $n_e$ for each of the connections as described above, such as the depth for each of FIFOs 220 through 223. In other words, N is a function that maps edges, namely the elements of E, to the natural numbers N. The function N assigns each edge a buffer length.

Figure 3:
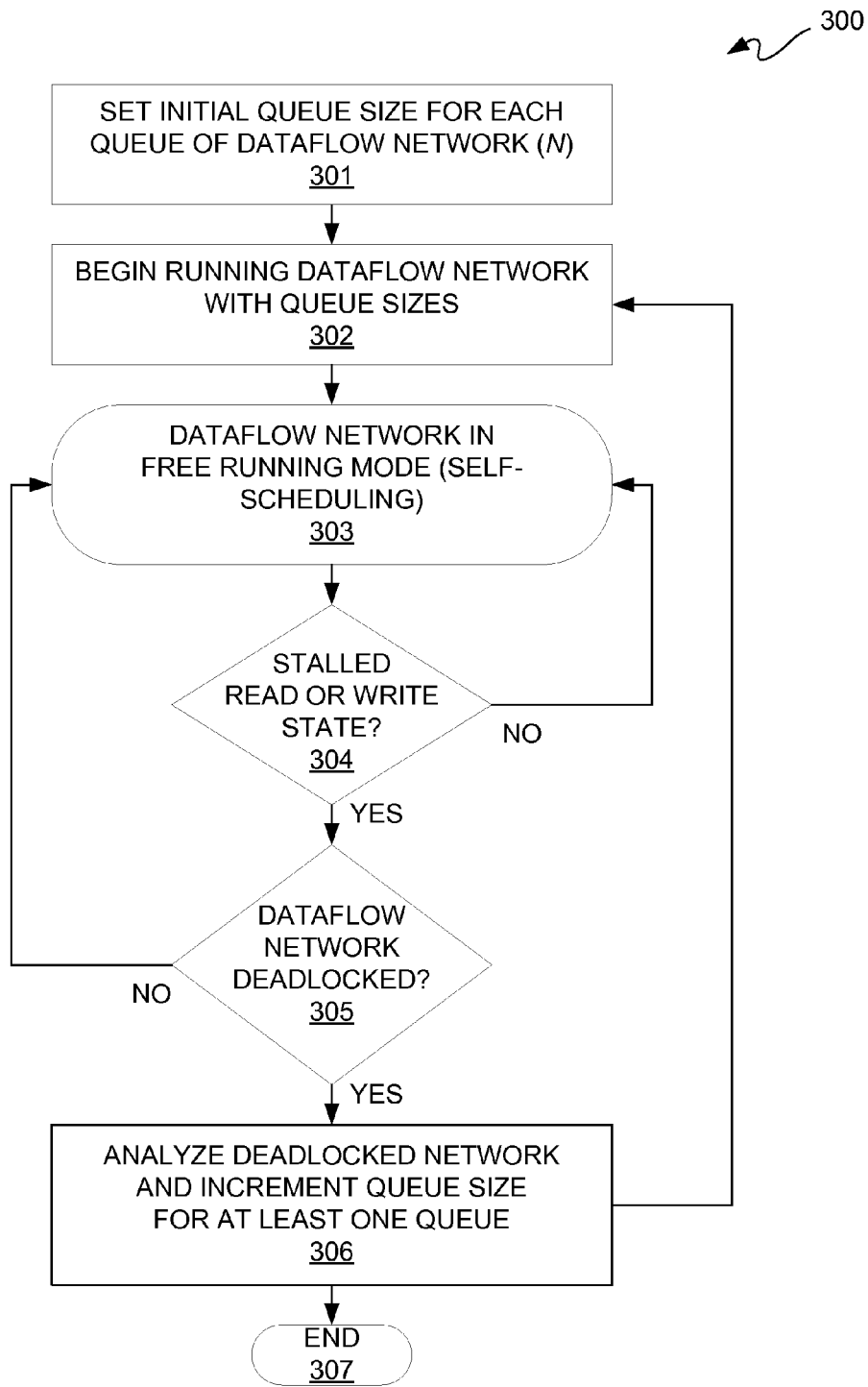
FIG. 3 is a flow diagram depicting an exemplary embodiment of a deadlock resolution flow.

FIG. 3 is a flow diagram depicting an exemplary embodiment of a deadlock resolution flow 300. Deadlock resolution flow 300 is initiated at 301 by setting initial queue sizes for queues of a dataflow network, such as dataflow network 200 of FIG. 2. Setting of queue sizes at 301 is referenced above as N. The remainder of deadlock resolution flow 300 is described with simultaneous reference to FIGS. 2 and 3.

At 302, dataflow network 200 is run. Queue sizes for FIFOs of dataflow networks are those set at 301. For example, dataflow network 200 is run with FIFOs 220 through 223 set to initial buffer sizes. Generally, the initial sizes of such FIFOs are relatively small. As shall become more apparent, the size of such FIFOs may be extended during resolution of deadlocks of dataflow network 200.

At 303, dataflow network 200 is in a free-running mode. By "free-running," it is meant that dataflow network 200 operates without any centralized scheduling. In other words, dataflow network 200 is self-scheduling based on the flow of data. By having a self-scheduling capability, it should be appreciated that dataflow network 200, or multiple instances of dataflow network 200, may be implemented with decentralized, distributed control. This capability may be useful for mapping dataflow networks to programmable logic. Furthermore, this decentralized, distributed control capability may be useful for mapping dataflow networks with processors for actors, whether such processors are implemented in programmable logic, hardware, or software, or a combination thereof.

Dataflow network 200 continues in a free-running mode between deadlocks of such dataflow network. At 304, it is determined whether an actor is in a stalled read phase or a stalled write phase. If an actor is not in a stalled read phase or a stalled write phase, dataflow network 200 returns to 303 and continues in a free-running mode. If an actor is in a stalled read phase or a stalled write phase as determined at 304, then at 305 it is determined whether dataflow network 200 is deadlocked, as described below in additional detail. If dataflow network 200 is not deadlocked as determined at 305, dataflow network 200 returns to 303 and continues in a free-running mode. In other words, dataflow network 200 continues in a free-running mode until all actors of such dataflow network 200 are in either a stalled read phase or a stalled write phase.

If, however, at 305 it is determined that dataflow network 200 is deadlocked, then at 306 the deadlocked dataflow network 200 is analyzed and one queue has its size incremented. In other words, at 306 there is at least an attempt to resolve deadlock of a dataflow network based on dependency structure between actors and the state of the queues of such network. It may not be possible to resolve a deadlock, and thus if such deadlock cannot be resolved, deadlock resolution flow 300 may end at 307.

As used herein, a dataflow network is "deadlocked," or more particularly an externally unconstrained dataflow network is "deadlocked," when no actors of such dataflow network are executing. Thus, all actors that are not dead actors in a dataflow network are either waiting for input or are waiting for output space. The set of actors stalled in a read phase may be denoted with an R, and the set of actors stalled in a write phase may be denoted with a W. Neither the set of R nor the set of W is empty, as some actors will be waiting for input and other actors will be waiting for output space. Furthermore, the actors associated with an output side of an interface of dataflow network 200 are not stalled for output space, and the actors associated with an input side of an interface of dataflow network 200 are not stalled for input, as it is assumed that dataflow network 200 is externally unconstrained.

Moreover, it should be understood that from a first set of sizes for queue sizes for a dataflow network a second set of sizes for the queue sizes is generated sufficient to reduce likelihood of deadlock of the data flow network. Thus, looping from operation 305 back to operation 303 may be performed until such no deadlock occurs. In general, there is not an analytic determination of the likelihood of a deadlock. Rather, the likelihood or probability of deadlock in general decreases as buffer sizes increase. For some classes of networks it may be provably shown that probability of deadlock may eventually go to 0. However, an example criterion for resolving deadlock is to make the minimal increment to buffer sizes such that a current deadlock condition is resolved and the previously deadlocked system can make at least one more operation. Accordingly, a connection is picked that is currently in state H.

Figure 4:
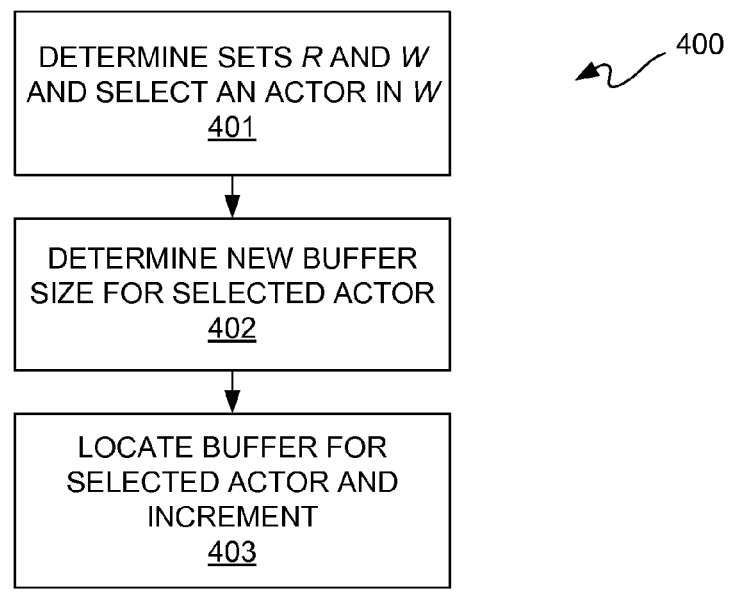
FIG. 4 is a flow diagram depicting an exemplary embodiment of a buffer size increment flow.

FIG. 4 is a flow diagram depicting an exemplary embodiment of a buffer size increment flow 400. Buffer size increment flow 400 may be used for operation 306 of deadlock resolution flow 300 of FIG. 3. With simultaneous reference to FIGS. 2 through 4, buffer size increment flow 400 is further described.

At 401, sets for R and W are determined, and an actor, α, from the set of write phase stalled actors W is selected. If W is empty, then there is an error in the design of dataflow network 200. At 402, a new buffer size is determined for the actor selected at 401. The new buffer size, n', may be determined according to Equation (1):

$$n': e \longmapsto \begin{cases} n(e)+1 & \text{for } s(e) = \alpha \text{ and } e \text{ in a high } H \text{ state} \\ n(e) & \text{otherwise,} \end{cases} \quad (1)$$

where the buffer size n(e) for a communication link e is incremented by 1 for a source communication link s(e) for an actor α being in W. In other words, it may be that the number of tokens to be written by an actor to an output space-bounded channel is unknown. Thus, the output buffer space for such channel may be incremented by one to provide a new buffer size n'.

At 403, an output buffer for an actor selected at 402 is located and buffer size of such output buffer is incremented as determined at 402. At 403, buffer size for the selected actor of dataflow network 200 may be updated accordingly, namely n(e) may be updated to provide buffer size n' as associated with a communication link e.

Dataflow network 200 may be run until deadlocked again. Then, iteratively, output space buffer size may be incremented by 1, until the dataflow network no longer deadlocks. Alternatively, if it is known how may tokens an actor is going to write to output space in a buffer associated with an output-side communication link thereof, a shortcut to reduce the number of iterations is to increment the buffer size by the corresponding number of tokens to be written. Thus, an operation to increment buffer size of a selected actor with respect to output space may be accomplished in a single step as opposed to iteratively over multiple single unit increment operations. Incrementing by one may not converge to a optimal dataflow network 200 with respect to buffer resources. While a suboptimal result may be sufficient, incrementing buffer size by the number of tokens to be written is more likely to converge to an optimal dataflow network 200 with respect to buffer resources.

By selecting an output-stalled actor to unlock a deadlocked dataflow network by extending buffer size associated with such output-side communication link of such actor, a substantial amount of computation to determine buffer size may be avoided by incremental addition of additional buffer space. Moreover, the amount of total buffer space added may be a minimum with respect to providing a dataflow network that does not have deadlock issues and uses a minimum number of buffer resources.

Figure 5:
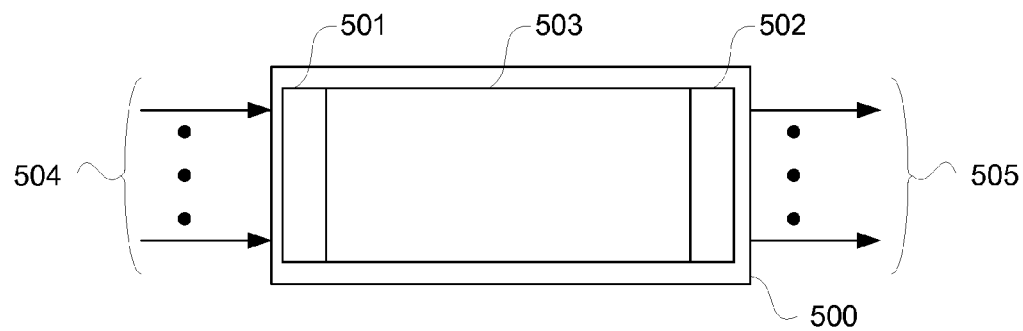
FIG. 5 is a block diagram depicting an exemplary embodiment of a dataflow network.

FIG. 5 is a block diagram depicting an exemplary embodiment of a dataflow network 500. Dataflow network 500 may have a set of input actors 501 and a set of output actors 502, where the set of input actors 501 is coupled to the set of output actors 503 by interim actors 503. Input data streams 504 may be processed by dataflow network 500 to provide output data streams 505. Output actors 502 are by definition stalled for input when dataflow network 500 is deadlocked. As previously described, output queue space for write-phase-stalled actors may be incremented. However, there may not be an exact solution to a deadlocked network, so a heuristic may be applied. As described below in additional detail, a heuristic that unlocks an actor which would allow some input data streams 504 to be processed by dataflow network 500 to allow more output via output data streams 505 may be used for choosing which actor in the set of write-phase-stalled actors, such as write-phase-stalled actors of interim actors 503, to select.

Figure 6:
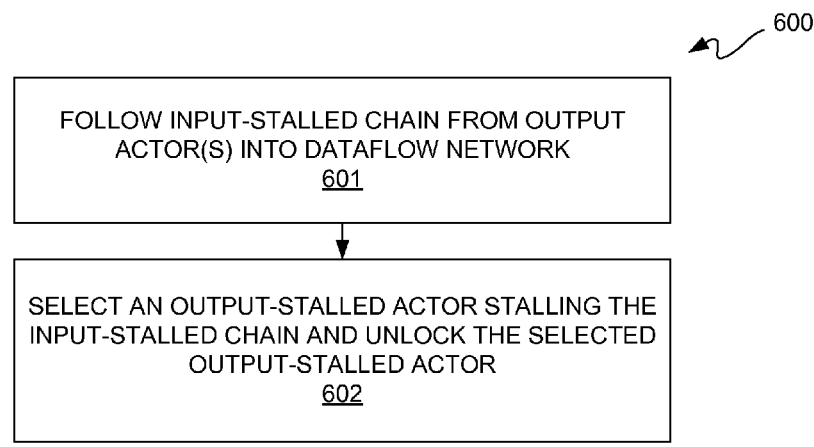
FIG. 6 is a flow diagram depicting an exemplary embodiment of a heuristic flow.

FIG. 6 is a flow diagram depicting an exemplary embodiment of a heuristic flow 600. Heuristic flow 600 may be used for determining queue sizes for write-phase-stalled selected actors at operation 306 of FIG. 3. At 601, an input-stalled actor chain is followed from output actors 502 further into dataflow network 500, namely to interim actors 503 and then to input actors 501. At 602, an output-stalled actor stalling such an input-stalled chain is unstalled by incrementing output queue size. Consider a set Y being a subset of the set of actors A which is defined to be the smallest set such that the following Equations, or logical relationships, (2) and (3) are true:

$$O \subset Y, \text{ and} \quad (2)$$

$$\alpha \in Y \wedge \alpha'' \in R \wedge \exists e \in E: (e \text{ low} \wedge s(e) = \alpha' \wedge d(e) = \alpha \Rightarrow \alpha' \in Y), \quad (3)$$

where O is the set of output actors 502, where α' indicates an output-stalled actor along the input-stalled chain, and where Y is a set of actors connected to outputs of dataflow network 500 that are starved for input.

A property of the set Y is that it is maximal in the sense that there is no input-starved actor outside of the set Y whose lack of output stalls the actors in the set Y. In other words, any such actor would have to be the set Y. Consequently, actors in set Y are stalled due to lack of output from at least one actor in the set W of write-phase-stalled actors. The set of actors in the set W of write-phase-stalled actors at the edge of the set of Y which are stalling a member of the set Y is called set X and is defined as follows in Equation (4):

$$X =_{def} \{\alpha \in W: \exists e \in E: s(e) = \alpha \wedge d(e) \in Y \wedge e \text{ low}\}. \quad (4)$$

Set X is not empty, and one of the actors in set X is selected at 602 to be unstalled in order to resolve a deadlock of dataflow network 500. Set X is defined to be the set of write-blocked actors that input-stalls actors in set Y.

If there is more than one actor in set X, a choice is made among the actors in set X as to which one to unstall in order to resolve the deadlock of the dataflow network. Accordingly, the actor selected at 602 is in set X. Furthermore, at 602, if there are multiple actors in set X, criteria may be used for selecting among them. Examples of such one or more criteria that may be used include: the smallest additional queue space need to unstall an actor and unlock the dataflow network; the distance to an output actor of output actors 502, which may be either a shortest or longest distance; or the number of actors unstalled by output from a selected actor, whether directly or indirectly.

Identification of a queue that is a candidate for dynamic expansion of capacity to unlock a deadlocked dataflow network may depend on finding at least one actor that is in the set W and identifying an output queue from that actor to one in set X. For a given actor, information associated therewith may be used to determine whether the actor is starved for input. First information for an actor may include a set of executable ("fireable") actions based solely on non-token criteria. These criteria include actor state and evaluation of guard terms based on actor state variables. It is assumed that no actors have non-fireable actions based solely on a token value in the head of a queue associated therewith.

Second information which may be used to determine whether an actor is in set Y may involve selecting the queue is that is in state H and starts at an actor in X, as these two conditions imply that such an actor is waiting on that queue. Accordingly, by increasing size of such a queue, this previously stalled actor can write its token(s) and thus perform at least one more operation.

An actor is in set Y if all potentially fireable actions are stalled due to insufficient input tokens. To determine if an actor is in set W, some information may be useful. The set of fired actions for which all execution is complete but for which one or more token writes are stalled due to insufficient output space may be termed set T. Fireability is not conditioned upon output queue capacity. If an actor is in a write-phase-stalled state, namely in set W, then any action for such actor is in set T. Multiple actions may be fired or be able to be fired, or a combination thereof, simultaneously, so long as their execution is atomic with respect to the other firing or able-to-be-fired actions, respectively.

Identification of a candidate queue for dynamic expansion involves finding an actor in set W which is directly connected to an actor in set Y via a queue which is in a high H state. Referring to FIG. 2, FIFOs 220 through 223 may be self-identifying as indicated via control signals 230 through 233 respectively. Each queue, such as FIFOs 220 through 223, may receive an indicator signal from a source actor, such as actors 210 through 212, indicating whether it is attempting a write. For example, actor 211 may indicate to FIFO 223 whether actor 211 is going to attempt a write to FIFO 223. Queues, such as FIFOs 220 through 223, may have internally generated signals to identify a full condition. For example, FIFO 223 may indicate to actor 211 that it is full in order to stall the write. Continuing the above example, FIFO 223 may provide control signaling via communication channel 551 to actor 211 to indicate a full status in order to stall the write by actor 211. FIFO 223 may provide a control signal 233 indicating that it is full to deadlock resolution block 201. Actor 211 may provide a deadlocked signal 241 to deadlock resolution block 201 to indicate a deadlocked state of actor 211. In this manner, actors may effectively be "score boarded" as either being stalled or not stalled using a single bit for each actor. Each actor may include read/write stall circuitry to indicate whether such actor is in a read-phase stalled or a write-phase stalled state.

The combination of a source-actor-write stall and a queue-full condition may be sufficient to identify a high H state. Additionally, a destination actor, for example actor 212, may provide a signal indicating whether such actor meets criteria for being in set Y. This signal may be provided from the destination actor to a queue, namely actor 212 to FIFO 223. Thus, a queue, such as FIFO 223, may self-identify as to whether it is a candidate for allocation of additional queue capacity. For example, FIFOs 220 through 223 may respectively provide control signals 230 through 233 to deadlock resolution block 201 for such self-identification. This evaluation may be done by deadlock resolution block 201 to determine that such a queue is in a high H state, and a destination actor indicates that it is in set Y. Accordingly, control signaling may be between each of the FIFOs and deadlock resolution block 201, not only for receiving status on FIFOs, but also for providing an incremental adjustment to such FIFOs. In other words, deadlock resolution block 201 may incrementally or otherwise adjust each of the FIFOs in order to increase their buffer size. Furthermore, actors, such as actors 210 through 212, may provide control signaling to deadlock resolution block 201 to indicate whether they are in a read- or write-stalled state, such as control signals 240 through 242.

Allocation of additional queue capacity may be done by deadlock resolution block 201, which may be a centralized controller for a dataflow network 200. Allocation of additional queue capacity by deadlock resolution block 201 may be performed responsive to control signals received from FIFOs, as well as actors. For example, if FIFOs 220 through 223 are implemented using BRAMs, deadlock resolution block 201 is responsible for allocation of BRAM capacity to implement additional queue capacity, as well as for handling routing of data and control signals associated with that capacity.

Such additional queue capacity may involve signaling associated with data such as valid and full, among other known types of data control signaling. Implementation of memory backing queue extension may vary based on application parameters. Furthermore, it should be appreciated that such a backing memory may be a centralized random access memory structure, distributed random access memory structure, a collection of allocatable FIFO structures, ring buffers, or other buffer capability, or a combination thereof.

Responsive to the likelihood of a deadlock of a dataflow network reoccurring if additional allocated queue capacity is reclaimed, such as reclaimed by deadlock resolution block 201, deadlock resolution block 201 may optionally be configured for monotonically increasing queue sizes responsive to a deadlock occurrence. The amount by which queue capacity is increased may vary from application to application; for example, queue sizes may grow by single increments, by a percentage of current capacity, by fixed units of allocable memory, or by some other monotonically incremental value, or a combination of one or more of these. Queue capacity may be increased by allocating additional storage to the queue, or by daisy chaining allocatable queue instances. With respect to the allocating additional storage to the queue, a configurable queue implementation may be suitable for handling complex token types where capacity may be increased by arbitrary amounts. With respect to daisy chaining, there may be benefit to its use when queue types are relatively simple or when there are relatively few queues to which extendibility is to be applied, or a combination of both of these factors.

Figure 7:
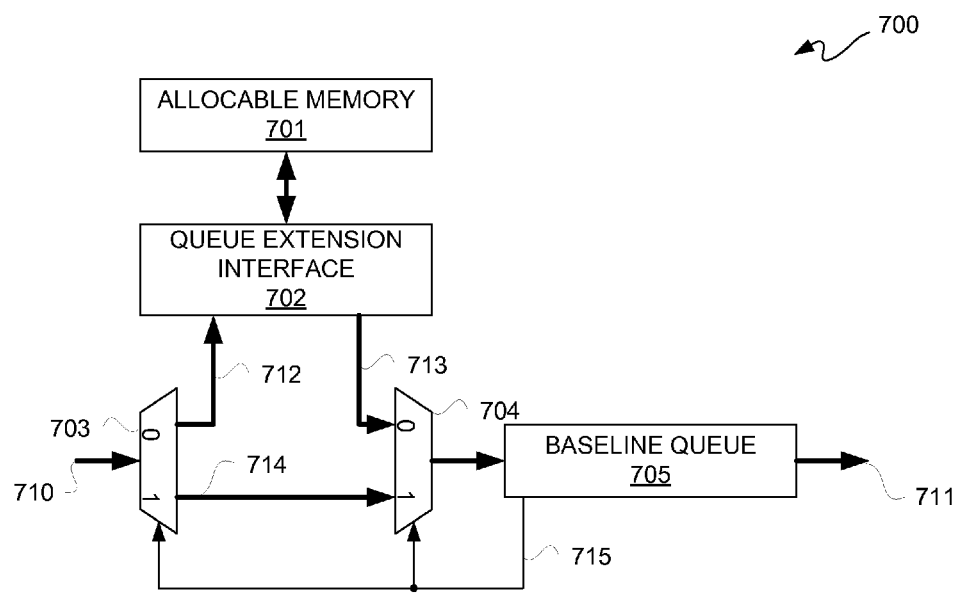
FIG. 7 is a block/circuit diagram depicting an exemplary embodiment of a dynamically extendible queue.

FIG. 7 is a block/circuit diagram depicting an exemplary embodiment of a dynamically extendible queue 700. Queue 700 includes allocable memory 701, queue extension interface 702, demultiplexer 703, multiplexer 704, and baseline queue 705. Queue 700 is extendible during runtime as described below in additional detail.

Baseline queue 705 has a baseline level of queue capacity. The baseline level of queue 705 may be allocated by a user. Alternatively, the baseline level of queue 705 may be set responsive to flow 300. Furthermore, alternatively, the baseline level of queue 705 may be set using static analysis.

Dataflow input 710 may be from a source actor. Dataflow input 710 is provided as an input to demultiplexer 703. A full signal 715 from baseline queue 705 is used as a control select signal for both demultiplexer 703 and multiplexer 704. Full signal 715 in this example is active low to indicate that baseline queue 705 is full. In other words, if baseline queue 705 is not full, full signal 715 is a logic high. For a logic high, demultiplexer 703 selects output path 714 for output therefrom. Furthermore, multiplexer 704 responsive to full signal 715 being inactive high selects input on datapath 714 for output to baseline queue 705. Output of baseline queue 705 is dataflow output 711, which may be provided to a target or destination actor.

Queue extension interface 702 is included in an active data path when baseline queue 705 indicates a full condition. Thus, when full signal 715 is active low, demultiplexer 703 selects datapath 712 for output. Datapath 712 is an input of queue extension interface 702. Queue extension interface 702 may be coupled to allocable memory 701. Allocable memory 701 is for storage of tokens. Accordingly, queue extension interface 702 provides both control logic and interface signals for interacting with an allocation of token storage of allocable memory 701. Output of tokens stored in allocable memory 701 may be provided to queue extension interface 702 for output to datapath 713. Datapath 713 is provided as another input to multiplexer 704.

Allocation of a specific amount of token storage may be under control of a controller, such as deadlock resolution block 201 of FIG. 2, which is separate from queue extension interface 702. Accordingly, extendible queue 700 may be coupled to deadlock resolution block 201 with control signaling as previously described. Queue extension interface 702 may be the interface to such controller and thus may provide control signals, not shown for purposes of clarity, to interact with deadlock resolution block 201 to set up parameters for communicating with an allocation in allocable memory 701. Thus, for example, in addition to data signals, a valid signal, a consume signal, and a full signal may be part of extendible queue 700. A consume signal, along with an asserted valid signal, may indicate that data is to be consumed for processing. A full signal may indicate state of baseline queue 705, as well as possibly the state of token storage in allocable memory 701.

Queue extension interface 702 may include control logic and registers to provide interaction with memory structures which back a queue extension subsystem. In other words, allocable memory 701 may be a large block of memory, including main or system memory, and thus there may be multiple extendible queues 700 fed from such memory. In such a configuration, an interface between queue extension interface 702 and allocable memory 701 may be a port of a multi-ported memory. Thus, for example, allocable memory 701 may be a BRAM having multiple read and write ports for supporting multiple extendible queues 700. Alternatively, allocable memory 701 may be dedicated to an extendible queue 700, and such allocable memory 701 may be of a fixed size.

Allocable memory 701 may be a FIFO. For queue extension interface 702 coupled to a FIFO version of allocable memory 701, such a FIFO may have an identification value which is stored in a register of queue extension interface 702 in order to route accesses through the specific FIFO used as allocable memory 701. If, however, queue extension interface 702 is coupled to a conventional memory interface, queue extension interface 702 may include registers for storage of parameters, including a base address and an address range, among other parameters, for communication with a conventional memory interface. Furthermore, queue extension interface 702 coupled to a conventional memory interface may further include logic to implement a FIFO-type storage for backing memory of baseline queue 705. An alternative to extendible queue 700 is to transpose the relative location of queue extension interface 702 and baseline queue 705, as illustratively shown in FIG. 8.

Figure 8:
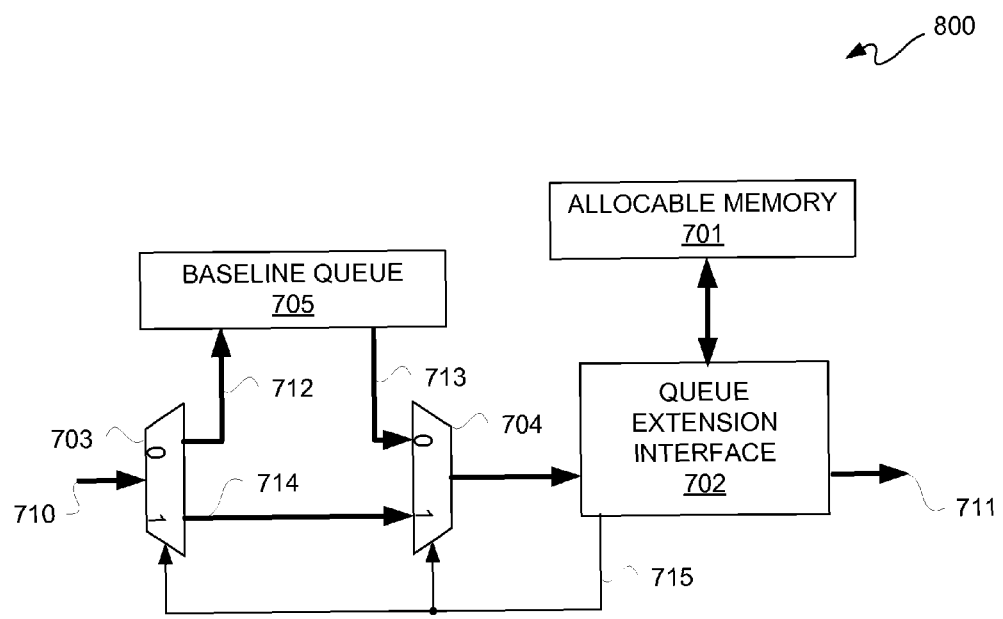
FIG. 8 is a block/circuit diagram depicting another exemplary embodiment of a dynamically extendible queue.

FIG. 8 is a block/circuit diagram depicting another exemplary embodiment of a dynamically extendible queue 800. Extendible queue 800 does not have different utility or functionality with respect to extendible queue 700. Dataflow interfaces for dataflow input 710 and dataflow output 711 of both extendible queues 700 and 800 may be the same, along with baseline queues 705 of such extendible queues. Consequently, relative ordering of tokens may be interchanged as between extendible queue 700 and extendible queue 800.

Depth of baseline queue 705 in both extendible queues 700 and 800 may have a valid depth of 0 for an implementation. In other words, such baseline queue 705 may be omitted. Alternatively, this may be thought of as a queue in which the bypass path associated with datapaths 712 and 713 is always active. For a queue in which the bypass path is always active, such a queue may be daisy chained with another queue allowing any edge, namely data connection from source actor to destination actor, to be extended in capacity until all token storage or allocatable queue implementations, or a combination thereof, are exhausted.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for queue sizing, comprising:
obtaining a dataflow network;
initializing queue sizes for queues of the dataflow network; the queue sizes being initialized to a set of first sizes;
running the dataflow network as distributed actors without having to have centralized control;
determining if the dataflow network is deadlocked after the act of running the dataflow network has begun;
analyzing using a controller coupled to the dataflow network causes for the dataflow network being deadlocked to select a first actor of the actors thereof;
selecting the first actor of the dataflow network as being in a stalled write phase state;
wherein the analyzing includes:
following an input-stalled chain of the dataflow network from at least a second actor of the dataflow network different from the first actor;
the second actor being an output actor of the dataflow network for providing output from the dataflow network; and
the first actor selected being one of a plurality of actors forming the input-stalled chain and causing the input-stalled chain to be stalled;
incrementing queue size for at least one queue of the queues to unlock the first actor from the stalled write phase state; and
iteratively repeating the running, the determining, the analyzing, and the incrementing to provide a second set of sizes for the queue sizes sufficient to reduce likelihood of deadlock of the data flow network.

2. The method according to claim 1, wherein the determining includes:
identifying a first set of actors and a second set of actors of the dataflow network;
the first set of actors being in the stalled write phase state and including the first actor; and
the second set of actors being in a stalled read phase state.

3. The method according to claim 1, wherein the analyzing includes:
identifying a first set of the queues as being full; and
identifying a second set of the queues as being empty.

4. The method according to claim 1, wherein the dataflow network is implemented entirely in software.

5. The method according to claim 1, wherein the dataflow network is implemented entirely in hardware.

6. The method according to claim 5, wherein the hardware includes programmable logic.

7. The method according to claim 1, wherein the input-stalled chain of the dataflow network is one of a plurality of actor chains for processing a plurality of dataflow input streams in parallel to provide a plurality of dataflow output streams in parallel.

8. The method according to claim 7, wherein the queues are implemented with random access memory configured as first-in, first-out buffers.

9. The method according to claim 1, wherein the first actor is selected using at least one criterion selected from a group consisting of smallest additional buffer space needed to unlock as compared with a remainder of the plurality of actors of the input-stalled chain; distance to the second actor; and number of actors unlocked by unlocking the first actor.

10. The method according to claim 1, wherein the dataflow network is free-running so as to be a self-scheduling network without having a scheduler.

11. A method for sizing queues of a dataflow network, comprising:
having actors and the queues coupled to one another to provide dataflow chains and coupled to a controller;
the controller configured to allocate storage for the sizing of the queues;
setting sizes of the queues of the dataflow network by:
initializing the sizes to a set of first sizes;
running the dataflow network as distributed actors without having to have centralized control;
determining if the dataflow network is deadlocked after the act of running the dataflow network has begun;
analyzing using the controller causes for the dataflow network being deadlocked to select a first actor of the actors thereof;
selecting the first actor of the dataflow network as being in a stalled write phase state;
wherein the analyzing includes:
following an input-stalled chain of the dataflow network from at least a second actor of the dataflow network different from the first actor;
the second actor being an output actor of the dataflow network for providing output from the dataflow network; and
the first actor selected being one of a plurality of actors forming the input-stalled chain and causing the input-stalled chain to be stalled;
incrementing size for at least one queue of the queues to unlock the first actor from the stalled write phase state; and
iteratively repeating the running, the determining, the analyzing, and the incrementing to provide a second set of sizes for the sizes of the queues sufficient to reduce likelihood of deadlock of the data flow network.

12. The method according to claim 11, further comprising:
reducing the storage allocated as associated with the second set of sizes of the queues; and
dynamically increasing capacity of one or more of the queues responsive to deadlock of the dataflow network.

13. The method according to claim 12, wherein the controller is configured to provide the dynamically increasing responsive to detection of the deadlock of the dataflow network.

14. The method according to claim 12, wherein the dynamically increasing includes monotonically increasing the sizes of the queues.

15. The method according to claim 12, wherein the dynamically increasing includes daisy chaining allocable queue instances of the queues.

16. The method according to claim 11, wherein the storage is selected from a group consisting of a centralized random-access memory structure, a distributed random-access memory structure, a collection of allocable first-in, first-out structures, and ring buffers.

17. A system for queue sizing, comprising:
a dataflow network comprising a plurality of distributed actors running without centralized control, and a plurality of queues associated with the plurality of distributed actors, wherein the plurality of queues are initialized to a first set of sizes; and
a controller coupled to the dataflow network, wherein the controller is configured to analyze causes for the dataflow network being deadlocked to select a first actor of the plurality of distributed actors as being in a stalled write phase state, increment at least one of the sizes in the first set for at least one queue of the plurality of queues to unlock the first actor from the stalled write phase state; and provide a second set of sizes for the plurality of queues to reduce a likelihood of deadlock of the dataflow network, wherein:
the controller is configured to analyze the causes for the dataflow network being deadlocked by following an input-stalled chain of the dataflow network from at least a second actor of the dataflow network different from the first actor;
the second actor is an output actor of the dataflow network for providing output from the dataflow network; and
the first actor selected is a part of the input-stalled chain that causes the input-stalled chain to be stalled.

18. The system of claim 17, wherein the controller is configured to analyze the causes for the dataflow network being deadlocked by identifying a first set of the plurality of queues as being full, and identifying a second set of the plurality of queues as being empty.

* * * * *